(12) United States Patent
Anderson et al.

(10) Patent No.: US 7,205,764 B1
(45) Date of Patent: Apr. 17, 2007

(54) METHOD AND APPARATUS FOR INCREASING THE DETECTION SENSITIVITY IN A HIGH RESOLUTION NMR ANALYSIS

(75) Inventors: Weston Anderson, Palo Alto, CA (US); Atholl Gibson, Walnut Creek, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/401,795

(22) Filed: Apr. 11, 2006

(51) Int. Cl.
*G01V 3/00* (2006.01)
(52) U.S. Cl. .................................... 324/307; 324/318
(58) Field of Classification Search ........ 324/300–322; 600/410–424
See application file for complete search history.

(56) References Cited

U.S. PATENT DOCUMENTS

| | | | |
|---|---|---|---|
| 3,475,680 A | | 10/1969 | Anderson et al. |
| 5,023,555 A | * | 6/1991 | Ehnholm .................... 324/318 |
| 6,008,644 A | * | 12/1999 | Leunbach et al. .......... 324/300 |
| 6,108,574 A | * | 8/2000 | Ardenkjaer-Larsen ...... 600/420 |
| 6,466,814 B1 | * | 10/2002 | Ardenkjaer-Larsen et al. .......................... 600/420 |
| 6,515,260 B1 | | 2/2003 | Anderson |
| 2002/0107439 A1 | * | 8/2002 | Hersman et al. ............ 600/410 |
| 2005/0107696 A1 | * | 5/2005 | Griffin et al. ............... 600/431 |
| 2005/0245815 A1 | * | 11/2005 | Hersman et al. ............ 600/410 |
| 2006/0192559 A1 | * | 8/2006 | Ardenkjaer-Larsen et al. .......................... 324/321 |

OTHER PUBLICATIONS

Article by Ardenkjaer-Larsen, Jan et al., entitled "Increase in signal-to-Noise Ratio >10,000 Times in Liquid-State NMR", published by PNAS, Sep. 2, 2003, vol. 100, No. 18, pp. 10158-10163.
Article by Wolber, et al., entitled "Generating Highly Polarized Nuclear Spins in Solution using Dynamic Nuclear Polarization", published in Nuclear Instruments and Methods in Physics Research, A526 (2004), pp. 173-181.
Article by Henstra, A. et al., entitled "High Dynamic Nuclear Polarization at Room Temperature", published by Chemical Physics Letters, vol. 165, No. 5, Jan. 5, 1990, pp. 6-10.
Article by Hausser, KH et al., entitled "Optical Spin Polarization in Molecular Crystals", published by Advances in Magnetic Resonance, vol. 8, pp. 83-121 (1976).
Article by Bensasson, RV et al., entitled "Benzophenone Triplet Properties in Acetonitrile and Water", published by JCS Faraday 1, 1980, 76, pp. 1801-1810.
Article by Blank A, et al. entitled "Interaction between Polarized Triplets and Stable Radicals in Liquid Solutions", published by J. Phys.Chem A, vol. 105, No. 20, 2001, pp. 4799-4806.

* cited by examiner

*Primary Examiner*—Brij B. Shrivastav
(74) *Attorney, Agent, or Firm*—Bella Fishman (57) ABSTRACT

Enhanced nuclear polarization of a magnetic resonance sample provides greater detection sensitivity over conventional NMR spectroscopy due to a method and an apparatus of increasing the detection sensitivity. Molecules capable of forming photo-excited triplet states are combined in a solution with a NMR sample. While in a uniform magnetic field the solution is frozen, optical radiation is applied to produce photo-excited triplet states molecules and a microwave radiation is applied to stimulate transitions of one of the triplet lines producing dynamic polarization of the nuclei in the magnetic resonance sample. The frozen sample is then rapidly melted and a NMR analysis is performed.

18 Claims, 5 Drawing Sheets

PRIOR ART
FIG. 1A

MAGNETIC FIELD STRENGTH

METHOD AND APPARATUS FOR INCREASING THE DETECTION SENSITIVITY IN A HIGH RESOLUTION NMR ANALYSIS

FIELD OF THE INVENTION

This invention relates to high-resolution nuclear magnetic resonance (HR NMR) and in particular to a method and apparatus for increasing the sensitivity of NMR analysis and for the polarization of polarized biologically important molecules for in vitro or in vivo use.

BACKGROUND OF THE INVENTION

NMR is a powerful technique for analyzing molecular structure. However it is also an insensitive technique compared to other techniques for structure determination. There has been a continued effort to increase the sensitivity. Prior efforts that have greatly increased the sensitivity of the technique comprise the use of Fourier Transform (U.S. Pat. No. 3,475,680), higher magnetic field strengths through the use of superconducting magnets, and the use of cooled and/or superconducting Radio Frequency (RF) receiving coils. Sensitivity can also be gained by lowering the sample temperature, to gain sample polarization. Most liquid samples freeze, forming a solid if the sample temperature is substantially lowered, yielding broad NMR lines that obscure the details of the NMR spectrum. The U.S. Pat. No. 6,515,260, assigned to the Assignee of the present invention, teaches polarizing the sample at a very low temperature and then melting the sample by quickly heating it to near room temperature. An NMR measurement is then performed before the sample has time to achieve thermal equilibrium at the higher temperature. Other methods of hyperpolarization, i.e. increasing the polarization of the sample above the polarization that could be obtained by thermal polarization alone include Dynamic Nuclear Polarization (DNP), Chemically Induced Nuclear Polarization (CIDNP) and Para-Hydrogen Induced Polarization. These last two methods can only be used to polarize selected molecules.

Ardenkjaer-Larson et al [Proceedings of the National Academy of Science volume 100, pages 10158–10163 (2003)] and J. Wolber et al [Nuclear Instruments and Methods in Physics Research A, Volume 526, pages 173–181 (2004)] have demonstrated an increase in signal-to-noise ratio of >10,000 times in liquid-state NMR. The result was obtained by adding the analyte to a suitable solvent containing a free radical. The solution was then frozen and cooled to a temperature in the range of 1.5 Kelvin in a polarizing magnet with a magnetic field of 3.35 Tesla and allowed to achieve thermal equilibrium. (At this temperature the thermal polarization of a free radical is approximately 90%). A Dynamic Nuclear Polarization (DNP) technique was used to transfer a fraction of this electron polarization to one of the nuclear species in the analyte by irradiating the sample at a microwave frequency at or near the unpaired electron Larmor frequency, in this case at a frequency of approximately 94 GHz. This step transferred a fraction of the electron polarization to the nuclei in the sample. The sample was then quickly dissolved by mixing with additional unpolarized hot solvent thereby forming a liquid. The polarized liquid sample was then transferred to a standard HR NMR spectrometer where an enhanced NMR signal can be acquired. Unfortunately the experiment cannot be repeated using the same sample without additional processing to remove the excess solvent. The remaining paramagnetic ions in the sample also cause line broadening when acquiring the enhanced NMR signal.

There are a number of reports of generating high nuclear polarization in single crystals and polycrystalline material that have been doped with a photo-excited triplet-state forming molecule. Henstra et al (Chem. Phys. Lett., vol. 165, pages 6–10, 5 Jan. 1990) obtained a maximum enhancement of 5,500 of protons in a single crystal of naphthalene doped with pentacene, a photo-excited triplet state molecule. The experiment was carried out at room temperature. The triplet state was formed by irradiation of the crystal by a pulsed nitrogen laser. After the laser flash, the optically created electron spin polarization at sub-Kelvin spin temperature is transferred to the protons by applying a microwave pulse. The microwave pulse satisfies the Hartman-Hahn condition whereby the strength of the microwave field $B_1$ satisfies the condition $\gamma_e B_1 = \gamma_n B_0$, where $\gamma_e$ and $\gamma_n$ are the gyromagnetic ratios of the electron and the nucleus (is this case the proton) respectively. The integrated solid effect (ISE) was provided during the microwave pulse by sweeping the magnetic field through the nuclear line width. This process was repeated at a 25 Hz rate with an average laser power of about 70 mW. The pulsed microwave irradiation was applied starting 1 µs after each laser shot and had duration of 10 or 15 µs. The maximum proton polarization was obtained after 60 minutes of irradiation. Other similar experiments have been carried out on single crystal or polycrystalline solid materials. This and similar experiments produce high nuclear polarization of single crystal or polycrystalline molecules that form a triplet states molecules when photo-irradiated, however it does not enable the production of high polarization in liquid state molecules, or samples dissolved in liquid solvents as used in high resolution NMR experiments.

SUMMARY OF THE INVENTION

The present invention overcomes the aforementioned deficiencies and disadvantages of the prior art. It eliminates the requirement for the very low temperatures in order to obtain high election polarization, avoids the paramagnetic broadening of the NMR signal by paramagnetic ions and avoids the sample dilution, which enabling the experiment to be repeated or additional experiments performed without further sample purification. These and other advantages of the present invention are attained in the method of the present invention, which allows for enhancing the NMR signal sensitivity in liquid samples and apparatus for performing this method.

In accordance with the present invention, a low temperature is not required to achieve the high polarization of the sample. The sample is dissolved in a solvent containing a photo-excitable triplet state molecules forming a solution. The solution is frozen by cooling to a lower temperature forming a polycrystalline solid or glass and is placed in a magnetic field. The frozen solution is exposed to optical radiation causing optical transitions thereby exciting the triplet-state forming molecule to a triplet state molecule. The frozen solution is also exposed to microwave radiation causing transitions between magnetic sub-levels of the triplet-state molecule and thereby producing a high polarization of the nuclei in the solvent or analyte through a Dynamic Nuclear Polarization (DNP) process. If the polarization has been transferred to the solvent protons a further step is taken to transfer the polarization to the desired nucleus in the analyte. After a suitable nuclear polarization has been obtained, heat is applied to melt the solution and the desired NMR analysis is performed on the highly polarized nuclei of the analyte.

For performing a method of increasing detection sensitivity in high-resolution NMR analysis the NMR apparatus comprises a sample cell being transparent to RF, microwave, and optical radiation. The sample comprises a liquid solvent having molecular substance capable of forming a photo-excited triplet state molecules upon exposure to optical radiation with an NMR sample dissolved therein. The sample cell is surrounded by a dewar, which is also transparent to RF, microwave, and optical radiation. The dewar is coupled to a cold and a warm fluid sources for providing respectively cold and warm fluid to an exterior of the sample cell. A RF coil is mounted on an outer surface of the dewar for providing RF field in a selected region of the sample cell and connected to NMR spectrometer for detecting NMR signals induced in said RF coil. An apparatus further comprises an optical source for producing optical radiation onto the sample cell and a magnet providing a magnetic field in the region of the sample cell. A microwave structure coupled to a microwave spectrometer provides microwave magnetic field in the region of the sample. A computer is programmed to activate performance of the following operations: freezing the solution to a solid substance; exposing it to optical and microwave radiation for obtaining photo-excited triplet state molecules that transfers their energy to the NMR sample causing dynamic nuclear polarization of at least one nuclear species of the NMR sample, melting the frozen solution and analyzing the NMR sample.

BRIEF DESCRIPTION OF THE DRAWINGS

The foregoing aspects and advantages of the present invention will become better understood by reference to the following detailed description when taken in conjunction with the accompanying drawings, wherein.

The following numbering of the features are used in the FIGS. 1–5:

| | |
|---|---|
| 100 | lowest energy state |
| 101, 102 | optical transitions |
| 103, 104 | excited singlet state levels |
| 105 | fluorescence decay transition |
| 106 | radiationless transition |
| 107 | intersystem crossing transition |
| 108, 109 | triplet state levels |
| 111 | phosphorescence transition |
| 112 | radiationless transition |
| 120, 121, 122 | energy levels of triplet state $T_1$ |
| 124 | low field transition |
| 125 | higher field transition |
| 126, 127 | microwave transitions |
| 130 | magnetic field axis |
| 210 | sample preparation step |
| 220 | sample chilling step |
| 230 | third step |
| 240 | step of rapidly warming the sample |
| 250 | step of analyzing sample by NMR |
| 310 | graph of optical radiation intensity vs. time |
| 312 | optical radiation pulses |
| 320 | graph of microwave field vs. time |
| 322 | microwave pulse |
| 330 | graph of nuclear polarization vs. time |
| 332 | initial nuclear polarization |
| 334 | plot of polarization |
| 338 | maximum polarization |
| 340 | graph of magnetic field sweep vs. time |
| 342 | magnetic field sweeps |
| 400 | polarization enhancement apparatus |
| 402 | coordinate |
| 410 | magnet |
| 412 | pole pieces |
| 416 | magnet yoke |
| 418 | magnet windings |
| 420 | probe |
| 421 | sample cell |
| 422 | sample |
| 423 | fiber |
| 430 | NMR spectrometer |
| 432 | RF coils |
| 434 | microwave spectrometer |
| 436 | microwave transmission line |
| 438 | microwave resonator |
| 440 | optical radiation source |
| 442 | fiber optic bundle |
| 450 | cooling unit |
| 452 | cold fluid source |
| 454 | flexible tube |
| 456 | dewar |
| 458 | fluid dump |
| 459 | drain tube |
| 460 | warming unit |
| 462 | warm fluid source |
| 464 | flexible tube |
| 470 | programmer/computer |
| 480 | sweep generator |
| 482 | sweep coils |
| 484 | electrical cable |
| 500 | rectangular sample cell |
| 510 | face of the cell |
| 520 | sample cell cap |

DETAILED DESCRIPTION OF THE INVENTION

Figure 1A:
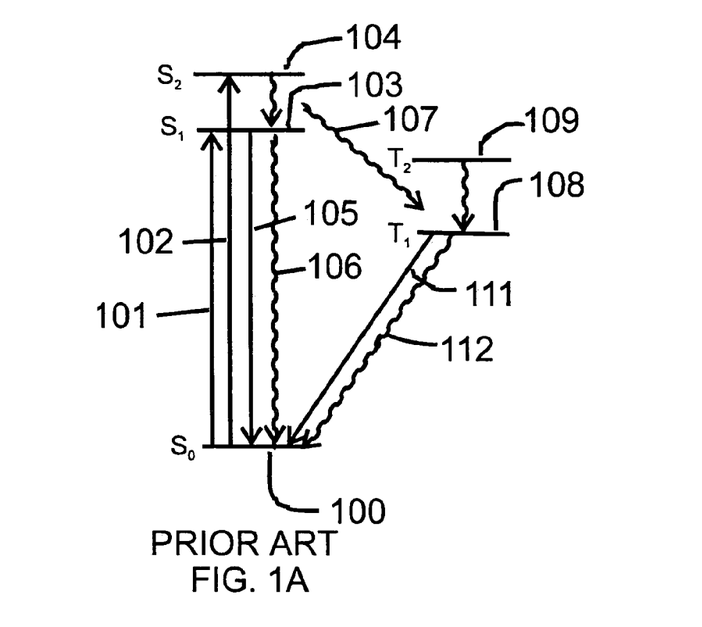
FIG. 1A is an energy level diagram of a photo-excited triplet-state molecule showing the optical transitions used to produce the triplet state molecules according to prior art.

FIG. 1A is an energy level diagram showing some of the energy levels of a photo-excited triplet-state forming molecule. [For example, Hausser & Wolf, "Optical Spin Polarization in Molecular Crystals", Adv. Magnetic Resonance 8, pages 83–121, (1976)] The molecule is normally in its ground or lowest energy state 100. This is a singlet state $S_0$. The application of optical radiation causes optical transitions 101 and 102 from the lowest energy state 100 to excited singlet states $S_1$ and $S_2$, indicated by levels 103 and 104 respectively. The lifetime of the higher singlet states are very short due to fast internal conversion to the first excited singlet state $S_1$ represented by energy level 103. The singlet state $S_1$, level 103, is depopulated by the following possible transitions. It may be depopulated either by a transition to the ground state, by a fluorescence decay represented by transition 105 or a radiationless transition 106, or by intersystem crossing transition 107 into the triplet manifold represented by triplet states $T_1$ and $T_2$ levels represented by energy levels 108 and 109 respectively. Transitions from the triplet state $T_1$, level 108, to $S_0$, the lowest energy state 100, are spin forbidden, therefore the triplet state level 108 has a relatively long lifetime depending upon the triplet molecule, its environment and the temperature. The lifetime of triplet state level 108 is limited by the finite lifetimes of phosphorescence transition 111 and radiationless transition 112.

Figure 1B:
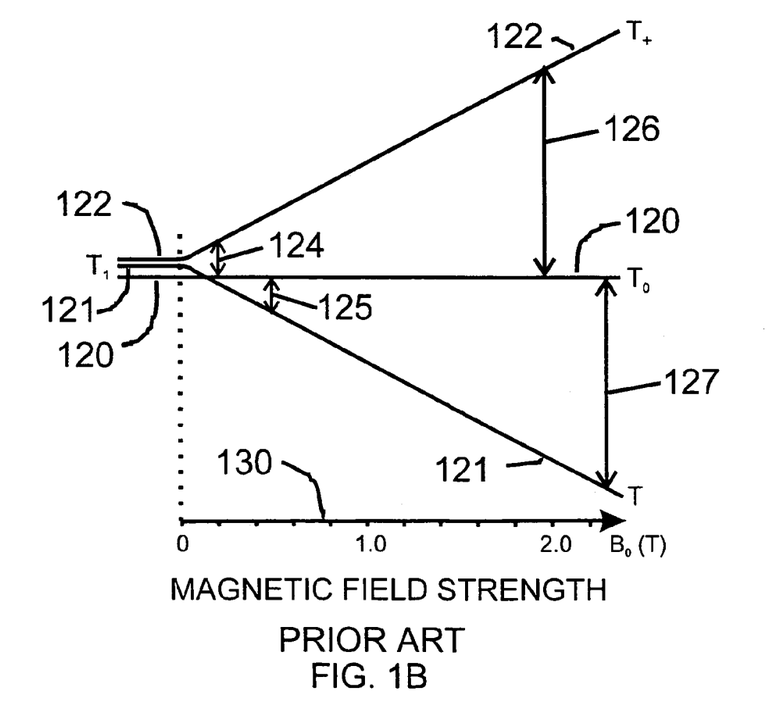
FIG. 1B is an energy level diagram of the lowest triplet state energy levels and their splitting as a function of the applied magnetic field according to prior art.

FIG. 1B shows an energy level diagram of the triplet-state $T_1$ according to the prior art. Due to the dipole—dipole coupling of the two unpaired electrons, triplet-state $T_1$ is split into three energy levels 120, 121, and 122. The transitions between these levels are in the radio frequency or microwave frequency range whereas the transitions between the energy levels of FIG. 1A are in the optical frequency range. As the applied magnetic field, $B_0$, is increased, as indicated by the magnetic field axis 130, the levels further split from each other. At large values of magnetic field the levels are labeled by $T_+$, $T_0$, and $T_-$ corresponding to the magnetic spin magnetic quantum numbers of $m_s$=+1, 0, and −1 respectively. In many cases when the triplet state is produced while the sample is in a strong magnetic field, the population of the To state with corresponding energy level 120 predominates and the populations of the levels 121 and 122 are much less. For a triplet state molecule, as represented by FIG. 1B, when sweeping the polarizing magnetic field from low to high magnetic field with a fixed relatively low microwave frequency, first the low field transition, 124, comes into resonance and appears as an absorption line. Then at higher fields transition, 125, comes into resonance and appears as an emission line. In other molecular orientations, the low field line may appear in emission and the high field line as absorption. The transitions 124 and 125 represent lines that might be observed at 9.4 GHz, and the microwave transitions 126 and 127 represent lines that might be observed at a 60 GHz.

Figure 2:
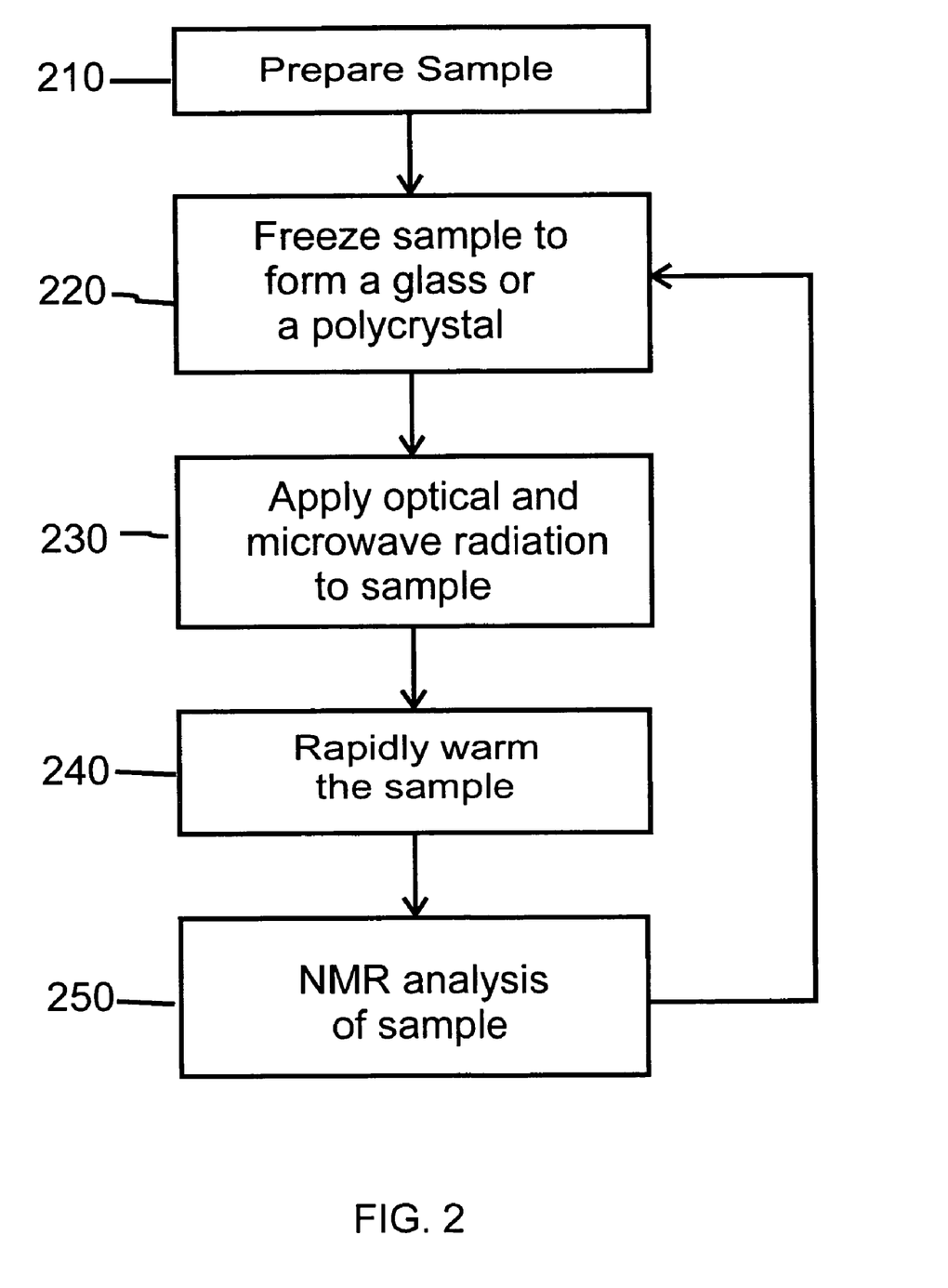
FIG. 2 is a flow chart illustrating the steps of obtaining increased sensitivity of an NMR analysis according to the present invention.

FIG. 2 is a flow chart illustrating steps in the process of obtaining increased NMR sensitivity in accordance with the preferred embodiment of the present invention. The first step, 210, refers to the preparation of a solution. This involves adding an analyte, i.e. the material to be analyzed, to a solvent containing photo-excitable triplet molecules. The solvent must be capable of dissolving the analyte. The solvent containing the photo-excited triplet-state forming molecules and the analyte molecules is denoted as a sample on FIG. 2.

There are a large number of molecules capable of forming a triplet state upon radiation by optical or ultraviolet (UV) radiation. Some are soluble in water or other polar solvents and some are soluble in non-polar solvents. A number of different polarizing solvent solutions may be made up with different properties suitable for dissolving different analyte materials. Some solvents are suitable for dissolving polar analytes and others are suitable for non-polar molecules. The solvent must be a liquid at room temperature (296° K) or near room temperature, and solidify at a lower temperature, preferably above liquid nitrogen temperature (77° K). Only a few examples will be given here to illustrate the method.

Benzophenone is a polar molecule capable of forming a photo-excited triplet state when exposed UV radiation. Good solvents for this molecule include water and acetonitrile. A typical concentration as a of the benzophenone between $2 \times 10^{-4}$ and $2 \times 10^{-5}$ mol per liter in water and $10^{-3}$ to $10^{-3}$ mol/liter in acetonitrile. [R. V. Bensasson & J. C. Gramain, J. C. S. Faraday I, Vol. 76, p. 1801–1810, (1980)].

Tetraphenylporphyrin, H2TPP, and its metal substituted ZnTPP are capable of forming a photo-excited triplet state in non-polar solvents such as mineral oil and benzene. Other examples of triplet-forming molecules in non-polar solvents include pentacene and anthracene in solvents of benzene and paradichlorobenzene for example. Another non-polar triplet-forming molecule/solvent is Etioporphyrin in a mixture of 1-chloronapthalene and paraffin oil in a 20:80 ratio. [A. Blank & H. Levanon, J. Phys. Chem. 105 (20), p. 4799, (2001)].

A number of different solvents with different photo-excited triplet molecules can be used to form solutions to meet the requirements of various analytes. The sample preparation step 210 of FIG. 2 involves adding the analyte to the solution containing the chosen solvent/triplet-state molecule thereby forming the sample used in the experiment. The sample is inserted into a quartz or sapphire NMR sample cell. To eliminate dissolved oxygen, several cycles of pump-freeze-thaw is applied to the sample before sealing the sample cell under a vacuum or inert atmosphere.

Figure 4:
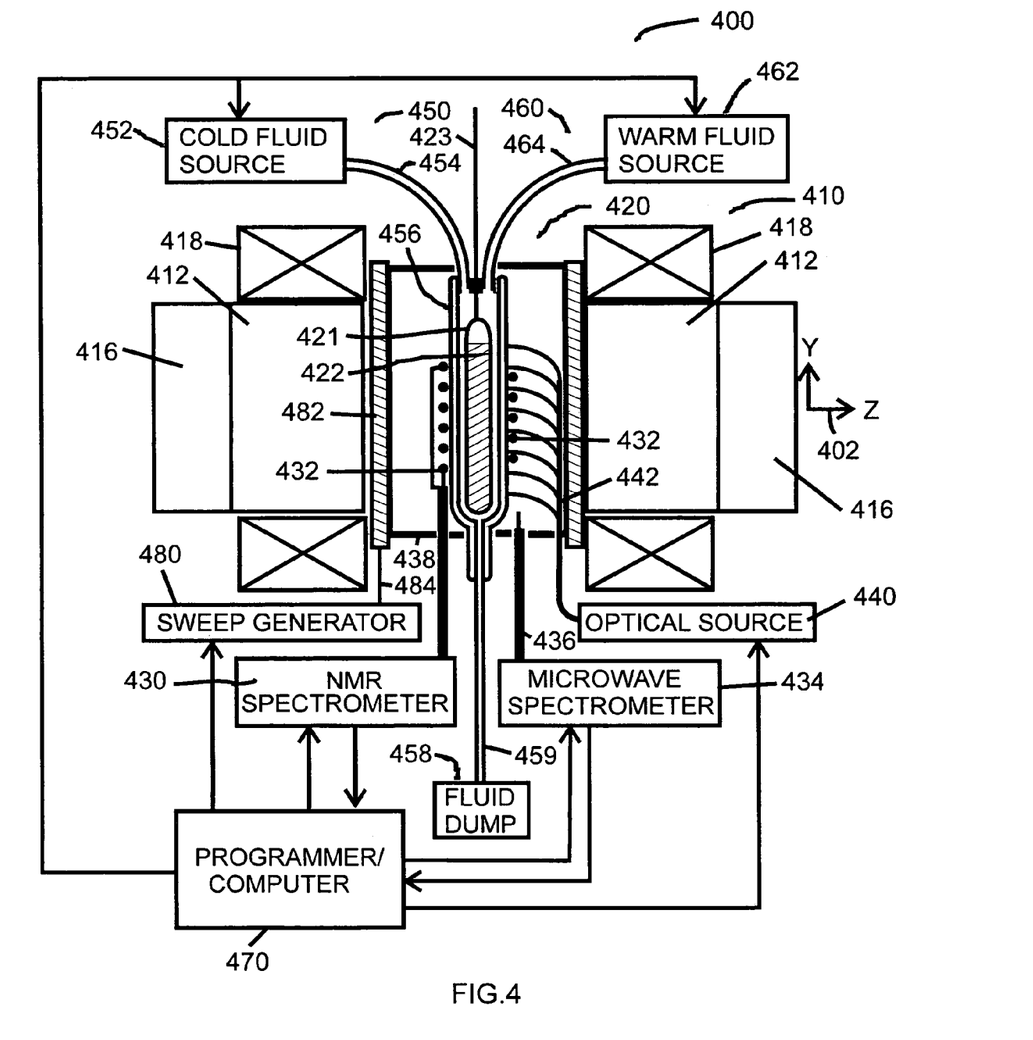
FIG. 4 is a schematic diagram of an NMR apparatus suitable for use in the method of the present invention.

In next step, 220 of FIG. 2, the sample is chilled until it forms a glass or polycrystalline solid. This step is normally carried out with the sample in the probe and with the probe in the magnet as shown in FIG. 4. If the cooling is external to the probe and magnet, the sample cell must be inserted into the probe and magnet before step 230 of FIG. 2 can be carried out. To freeze the sample it is cooled to a temperature below room temperature but normally greater than liquid nitrogen temperature (77° K).

The step 230 is carried out with the frozen sample in the probe, which is positioned within the magnet. In this step the frozen sample is exposed to optical radiation and microwave radiation. As was discussed above the optical radiation produces optical transitions leading to the generation of the triplet state molecules with total electron spin S=1. As this process is carried out in a strong magnetic field, $B_0$, most of the population ends up in the $m_s=\pm 0$ level. The frequency of the microwave radiation and the field strength of the strong magnetic field, $B_0$, are coordinated to cause transitions between the $m_s=0$ level and only one of the magnetic spin sub-levels $m_s=+1$. The magnetic field strength of the microwave field, $B_1$, is made to satisfy the Hartman-Hahn condition $\gamma_e B_1 = \gamma_n B_0$, where $\gamma_e$ is the ratio of the ratio of the angular frequency, $\omega_e$, of the chosen microwave transition and the DC magnetic field strength, $B_0$. In a preferred embodiment the optical radiation is applied in a series of pulses, with the microwave field pulsed on between each of the optical pulses. Each microwave pulse transfers some of the excess population of the $m_s=0$ state to the selected nucleus, n. The process is repeated a large number of times because the triplet state decays back to the singlet ground state typically in a few milliseconds. In a second embodiment, the magnetic field is swept through the electron line width during each microwave pulse thereby insuring transitions of all inhomogeneously broadened components of the electron line.

Figure 3:
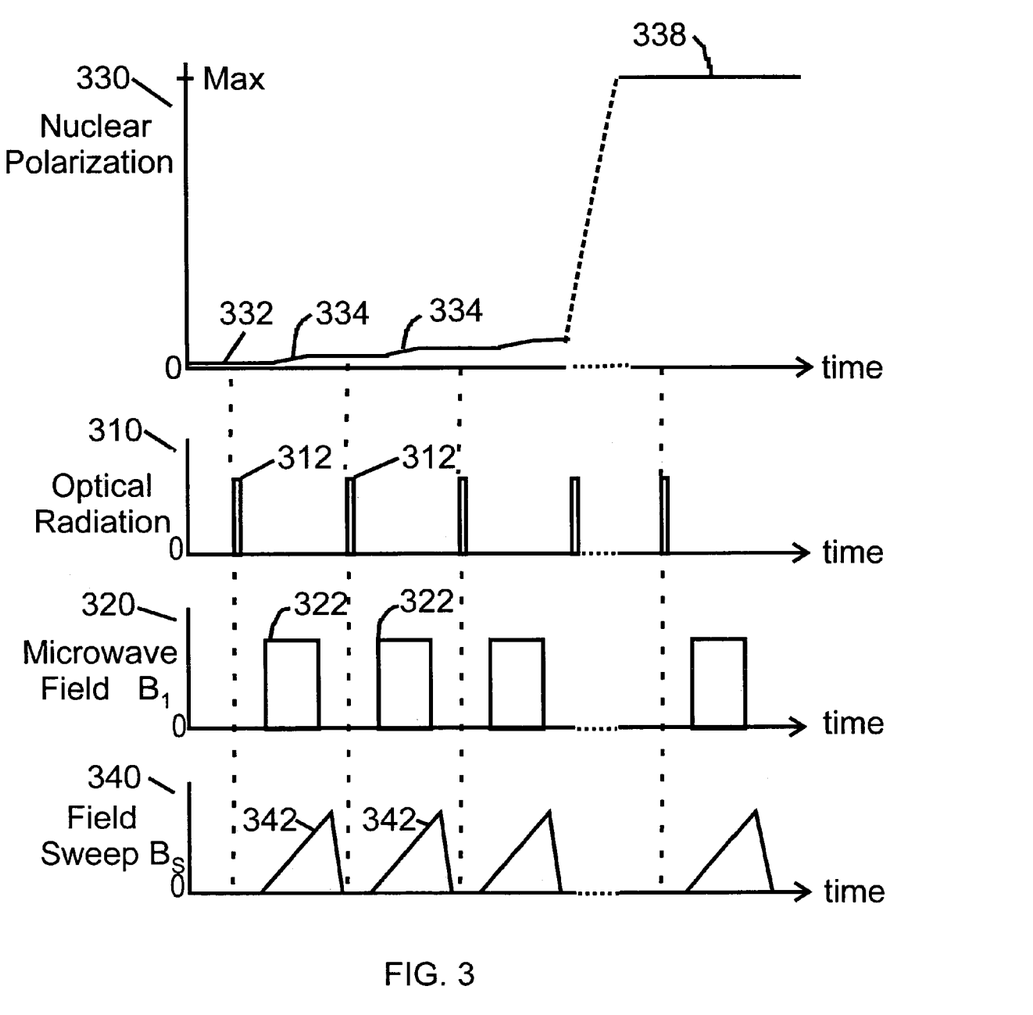
FIG. 3 shows a timing diagram indicating the sequence of optical and microwave pulses according to the present invention.

The sequence of these events is illustrated in FIG. 3. The graph 310 plots the optical radiation intensity verses time. The series of optical radiation pulses 312 are applied. The optical pulses are produced by an UV laser with each pulse lasting typically 50 nanoseconds and spaced by 40 milliseconds. Between each optical radiation pulse 312, a microwave pulse 322 is applied as sketched on graph 320 of the Microwave Field Intensity verses time. Typically each microwave pulse may last 30 milliseconds. The microwave field amplitude adjusted to satisfy the Hartman-Hahn condition, $\gamma_e B_1 = \gamma_n B_0$. Dynamic Nuclear Polarization (DNP)

process takes place during the application of the microwave power thereby increasing the polarization of the selected nucleus. On graph 330, FIG. 3, 334 plots the nuclear polarization as a function of time and indicates the polarization increases. After a large number of pulses, the polarization of the selected nucleus approaches a maximum polarization 338.

In the second embodiment a small magnetic field sweep is also applied as demonstrated in graph 340 of FIG. 3, showing the magnetic field sweep amplitude verses time. This small sweep field is applied thereby exposing all parts of the microwave transition to the microwave field $B_1$. The strength of the magnetic field sweep is sufficiently small to sweep only the one selected triplet transitions line. During each of these magnetic field sweeps 342, the polarization of the selected nucleus is increased through the Dynamic Nuclear Polarization (DNP) process as is illustrated in graph 330 of FIG. 3. The initial nuclear polarization 332 is just the thermal polarization as determined by the magnetic field strength $B_0$ and the nuclear gyromagnetic ratio $\gamma_n$ and the temperature T. As more optical and microwave pulses are applied the polarization builds up, and after many pulses it approaches a maximum polarization 338. A NMR spectrometer may be used to monitor the polarization build-up of the selected nucleus. A sufficiently weak RF pulse is used so as not to cause a substantial depolarization of the nucleus being polarized. It may be necessary to detune the observe RF coil to prevent loss of polarization by stimulated emission.

In the preferred embodiment, a protonated solvent is used, not deuterated as in the current state of the art. The polarization is transferred from the polarized electrons to the protons in the frozen solvent. These solvent protons will achieve a low spin temperature due to the short rigid-lattice spin—spin relaxation time $T_2$. A conventional nuclear Hartman-Hahn experiment is then performed to transfer the polarization from the cold, uniformly distributed solvent protons to the nuclei of interest in the analyte.

When sufficient nuclear polarization has been obtained or if the polarization is approaching a maximum steady state value, the sample is rapidly warmed as indicated by step 240 of FIG. 2. If the analysis is to be made in a different NMR spectrometer the sample must be transferred to its probe. A substantial advantage in resolution and sensitivity is gained by performing the analysis step at a high magnetic field in a modem NMR spectrometer. Normally the transfer process takes place after the warming step so that the spins are in the short-correlation time limit during the transfer so that $T_1$ stays long at the low fields encountered during the transfer. During the transfer process a small external field must be maintained at the sample to prevent the nuclei from depolarizing by random internal fields and magnetic field gradients. When a fluid is used to heat the sample, the final temperature of the fluid may estimate the sample temperature. In selected solvents, the position or relaxation time of one or more of the solvent lines may be temperature dependent thereby furnishing a independent estimate of the sample temperature.

The amount of heat required to melt the sample is held to a minimum by polarizing the analyte at a temperature only a few degrees below that required to freeze the sample to form a polycrystalline solid or a glass. If the solvent forms a "plastic crystal" it must be cooled below the rotational freezing temperature. The surface-to-volume ratio of the sample container is sufficiently large to rapidly transfer heat through the sample container wall and melt the sample in a few seconds or less. The heat transfer can be through thermal conduction or by microwave, RF, IR or optical radiation.

Since the sample is not heated by dissolution, it can be used again without any additional processing, permitting the experiment to be repeated in order to gather additional information and allowing traditional multidimensional NMR. In addition the lifetime of the triplet state is sufficiently short that by the time the NMR analysis is performed, the triplet state molecules will have decayed to their singlet ground states thereby leaving no paramagnetic molecules in the sample melt to broaden the NMR transitions.

When the sample temperature returns to the desired value, the analysis may be performed upon the selected nucleus. Normally only one experiment can be carried out before the polarization is depleted, but a second experiment on the same or different nucleus of the same sample can be carried out by repeating the steps 220–250. Since the sample has not been diluted or changed, one may use the same sample without further sample preparation. When the NMR analysis is complete, the experiments may be terminated.

FIG. 4 is a block diagram of an NMR system for performing the described above method of increasing detection sensitivity in the high resolution NMR analysis utilizing polarization enhancement apparatus 400, for enhancing the nuclear polarization of a liquid sample by means of photoexcited triplet molecules. The apparatus 400 comprises a magnet 410, a probe 420, NMR and microwave spectrometers 430 and 434 respectively, an optical radiation source 440, cooling and warming units 450 and 460 respectively, and a programmer/computer, 470. The illustrated apparatus 400 utilizes an electromagnet as might be used for an X-band microwave source. The magnet 410 consists of soft iron pole pieces 412, and a steel magnet yoke 416, that extends out of the plane of the drawing and returns the magnetic flux to the opposite pole piece.

The magnet windings 418, are powered by a DC magnet supply, not shown. The magnet produces a magnetic field in the Z-direction as indicated by coordinate 402.

In operation a sample 422 has been prepared as indicated in the description of step 210 of FIG. 2 and sealed in quartz or sapphire sample cell 421 and placed into probe 420. The sample is surrounded by a quartz or sapphire dewar 456, to thermally isolate the sample from the remainder of the probe. The sample is cooled by a the cold fluid source 452, which upon command from programmer/computer 470, supplies a cold gas such as Nitrogen or Helium or a cold liquid coolant such as Fluoroinert® or liquid nitrogen through flexible tube 454 to the top of dewar 456. The cold fluid surrounds sample cell 421 rapidly freezing the sample within. Excess fluid is drained into fluid dump 458.

Optical radiation is applied by optical source 440. The source is typically a pulsed laser source, such as a xenon laser producing 265 nm optical pulses under command of programmer/computer 470. The optical radiation is guided to the probe by fiber optic bundle (or light pipe) 442. Once in the probe the light is distributed along the sample cell by a separation of the fibers of the fiber optic bundle and spread along the quartz or sapphire dewar 456 to more uniformly illuminate sample cell 421. Between each optical pulse, programmer/computer 470 commands microwave spectrometer 434 to apply a microwave pulse through microwave transmission line 436 to microwave resonator 438. The transmission line may either be a co-axial cable or a microwave waveguide. Although resonator 438 was sketched as a rectangular cavity, many other microwave structures can be used to couple the microwave magnetic field $B_1$ to the sample depending upon the system design. Other possible resonator designs include cylindrical cavities, dielectric cavities, dielectric loaded cavities, and other microwave structures such as loop gap resonators, confocal resonators, horn and reflector, and slow wave structures.

In the second embodiment of the invention a magnetic field sweep is applied during the microwave pulse. Sweep generator 480 under control of programmer/computer 470 generates the electrical current for this sweep. The electrical current is fed to sweep coils 482 by electrical cable 484. The application of this field is illustrated by graph 340 of FIG. 3.

The build-up of nuclear polarization of the frozen sample may be occasionally monitored by NMR spectrometer 430 by applying a weak RF pulse to the RF coils 432 and monitoring the response. When sufficient polarization has been obtained, the cold fluid source 452 is turned off and the warm fluid source 462 is switched on. Warm fluid flows from source 462 through flexible tube 464 into dewar 456 that surrounds the sample cell 421, thereby rapidly warming and melting sample 422. The fluid may be a liquid such as Fluoroinert® or a heated gas such as helium or argon. Excess fluid is drained into fluid dump 458. Means can be provided for monitoring the temperature of the sample by thermally contacting it with a temperature sensor contacting the bottom of sample cell 421 with electrical leads threaded through drain tube 459 communicating and with programmer/computer 470 (not shown). With some solvent systems it may be possible to determine the temperature from a position of one of the solvent lines. When the sample is within the temperature range for obtaining the desired data, the analysis may be made using the NMR spectrometer 430. Alternatively the sample may be quickly removed by means of fiber 423 which is fixed to the top of sample cell 421. A pneumatic system (not shown) may also be used to remove the sample. The sample may then be placed in an NMR Spectrometer that operates at a higher magnetic field and perhaps has better capabilities for NMR analysis.

Figure 5:
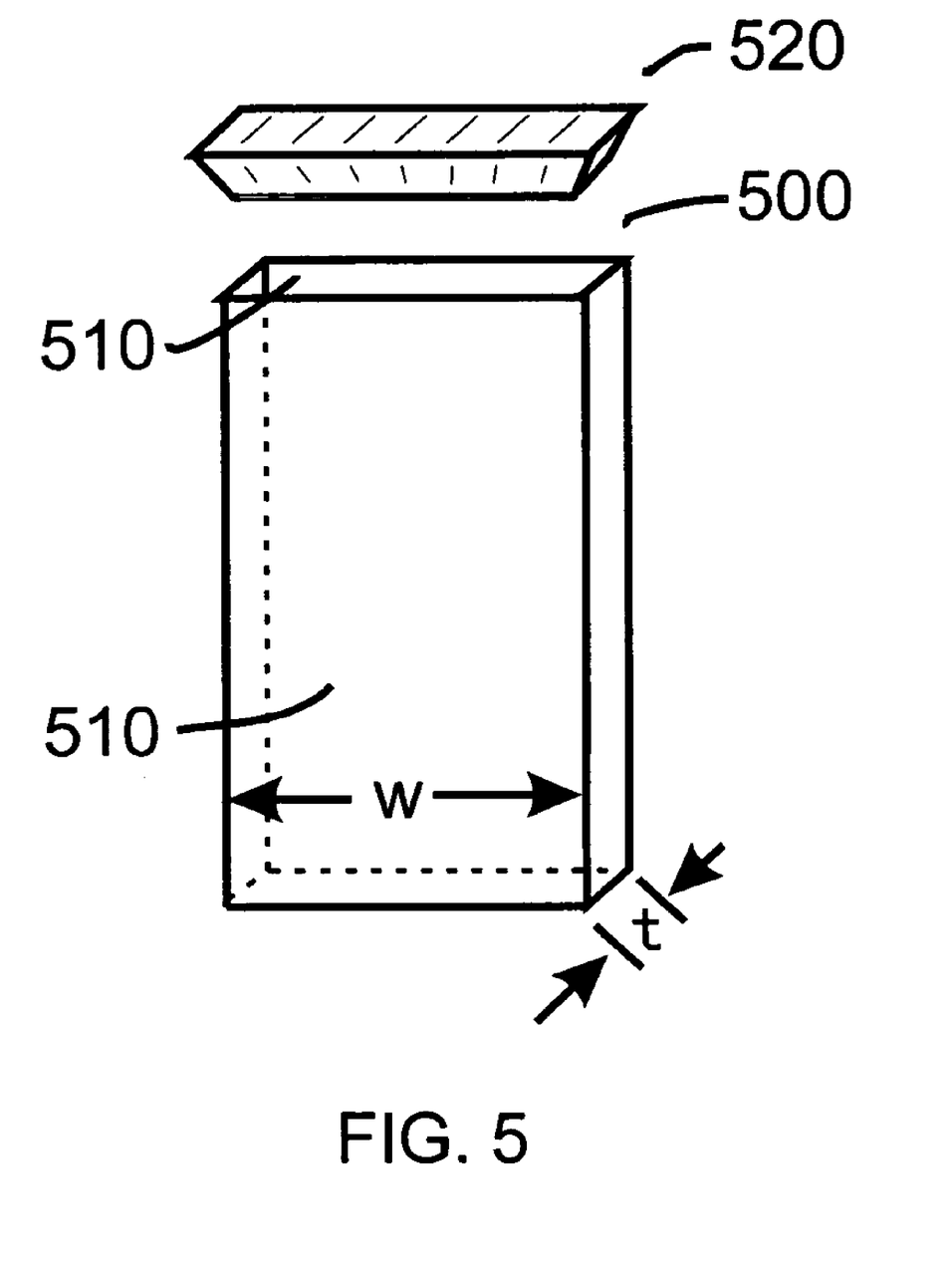
FIG. 5 is a perspective view of a rectangular-shaped sample cell according to the present invention.

The sample cell 421 may be a conventional cylindrical sample tube, or, according to a preferred embodiment, a cell with enlarged sample surface to volume ratio. Such cell permits a greater thermal pathway between the sample material and the cold or warm fluid used to cool and heat the sample respectively. FIG. 5 is a perspective view of a sample cell 500 with a greater sample surface to volume ratio to provide more rapid cooling and heating. The two rectangular faces 510 are closely spaced, separated by the cell thickness t. By making the cell width, w, large compared to the cell thickness, t, a greater cooling area is obtained. By requiring w t=$\pi r^2$ this cell has the same volume as a cylindrical sample cell of radius r and of the same length. The sample cell 500 has a cap 520 to seal the sample tube after the sample is loaded.

It will be appreciated by those skilled in the art that a number of variations are possible within the spirit and scope of the invention. For example the invention is equally applicable of being carried out in a superconducting magnet with the strong DC magnetic field aligned along the axis of a cylindrical sample. Other ways of heating the sample include microwave, RF, IR and optical radiation. The entire probe outside of the dewar containing the sample may be operated at room temperature or at a low temperature using either normal metals or superconducting materials for the RF coil and microwave resonator. A great number of different triplet state forming molecules and solvents may be used to produce the enhanced sample polarization. While the foregoing disclosure contains a number of details, it should be understood that these are given by way of example only. The scope of the invention should not be limited by the specific examples given above, but by the appended claims.

What is claimed is:

1. A method of increasing the detection sensitivity of a high resolution NMR analysis comprising the steps of:
    a) preparing a solution by dissolving an NMR sample material in a liquid solvent comprising molecular substance capable of forming a photo-excited triplet state molecules when exposed to optical radiation,
    b) applying a magnetic field to said solution;
    c) freezing said solution for forming a frozen solution being a solid substance;
    d) exposing said frozen solution to optical radiation for exciting the triplet state molecules therein;
    e) exposing said frozen solution to microwave radiation for exciting spin transitions in said triplet state molecules and causing dynamic nuclear polarization of at least one nuclear species of the frozen solution;
    f) melting said frozen solution by applying heat thereto; and
    g) analyzing said NMR sample material by performing an NMR analysis of the at least one polarized nuclear species.

2. The method of claim 1, wherein said at least one nuclear species of the frozen solution of step (e) is one nuclear species of the NMR sample material or a proton species of the solvent.

3. The method of claim 1, wherein said solution is sealed into a sample cell before applying the magnetic field thereto.

4. The method of claim 3, wherein the step (d) further comprises exposing said frozen solution to a series of pulses of optical radiation and the step (e) further comprises exposing said frozen solution to a series of pulses of microwave radiation, wherein
    each microwave pulse is applied between two neighboring pulses of the optical radiation.

5. The method of claim 4, further comprising applying a magnetic field sweep simultaneously with each said microwave pulse for sweeping the magnetic field and substantially bringing into resonance all parts of said electron spin transitions of the triplet state molecules.

6. The method of claim 1, wherein step (b) further comprises applying a first magnetic field to said solution and step (g) further comprises applying a second uniform magnetic filed to the NMR sample material.

7. The method of claim 6, wherein the magnetic field strength of said second magnetic field is greater than the magnetic field strength of said first magnetic field.

8. The method of claim 7, wherein said first and said second magnetic fields occur in different regions of one magnet.

9. The method of claim 1, wherein said microwave radiation of step (e) has a microwave angular frequency $\omega_e$ and a magnetic field strength $B_{1e}$ that satisfies the Hartman-Hahn condition $\gamma_c B_{1e} = \gamma_n B_0$, where $\gamma_c$ is the ratio of the ratio of the angular frequency, $\omega_c$, of the chosen electron spin resonance transition in said triplet state molecule to the DC magnetic field strength, $B_0$, of said magnetic field and $\gamma_n$ is the gyromagnetic ratio of the of said at least one nuclear species of frozen solution.

10. The method of claim 9, wherein said at least one nuclear species of frozen solution is a proton spin of the solvent, and further comprising applying two RF magnetic fields with angular frequencies $\omega_p = \gamma_p B_0$ and $\omega_n = \gamma_n B_0$ to simultaneously stimulate solvent proton resonance and nuclear resonance said selected nucleus in the NMR sample material respectively and to satisfy the nuclear Hartman-Hahn condition $\gamma_p B_{1p} = \gamma_n B_{1n}$ where $\gamma_p$ and $\gamma_n$ are the gyromagnetic ratios of the proton and said selected nucleus respectively and $B_{1p}$ and $B_{1n}$ are the RF field strengths of the two RF fields of angular frequency $\omega_p$ and $\omega_n$ respectively, and $B_0$ is the strength of the magnetic field.

11. The method of claim 1 wherein the step (f) further comprises thermal contact of the frozen solution with a heated fluid.

12. The method of claim 1, wherein steps (a) though (f) and step (g) are performed by different NMR spectrometer system.

13. A method of producing enhanced nuclear polarization of a NMR sample for performing an NMR analysis comprising the steps of:
  dissolving a NMR sample in a liquid solvent comprising photo-excitable triplet state molecules;
  freezing said liquid solvent for obtaining a solid substance;
  exposing said solid substance in a presence of a magnetic field to optical radiation forming photo-excited triplet state molecules;
  exposing said solid substance to microwave radiation polarizing one or more nuclei of the NMR sample by transferring energy thereto from the photo-excited triplet state molecules; and
  performing the NMR analysis of at least one polarized nuclear species of the NMR sample in a melted solvent.

14. The method of claim 13, further comprising the steps of exposing said frozen solid substance to a series of pulses of optical radiation and to a series of pulses of microwave radiation, wherein each microwave pulse is applied between two neighboring pulses of the optical radiation.

15. An NMR apparatus for performing a method of increasing detection sensitivity of high resolution NMR analysis comprising:
  a sample cell being transparent to RF, microwave, and optical radiation and comprising a liquid solvent having molecular substance capable of forming a photo-excited triplet state molecules upon exposure to optical radiation with NMR sample dissolving therein;
  a dewar surrounding said sample cell and being transparent to RF, microwave, and optical radiation;
  a cold and a warm fluid sources coupled to the dewar providing respectively cold and warm fluid to an exterior of the sample cell;
  an RF coil mounted on an outer surface of the dewar and providing RF field in a selected region of the sample cell;
  an optical source producing optical radiation onto the sample cell
  a magnet providing a magnetic field in the region of the sample cell
  a microwave spectrometer;
  a microwave structure coupled to the microwave spectrometer, which provides microwave magnetic field in the region of the sample;
  an NMR spectrometer connected to the RF coil, which detects NMR signals induced in the RF coil; and
  a computer programmed in assistance to perform the steps of freezing the solution to a solid substance; exposing it to optical and microwave radiation for obtaining photo-excited triplet state molecules that transfers their energy to the NMR sample causing dynamic nuclear polarization of at least one nuclear species of the NMR sample, melting the frozen solution and analyzing the NMR sample.

16. The apparatus of claim 15, further comprising a sweep generator and magnetic sweep coils, which are mounted on said magnet and electrically and coupled to the sweep generator thereby providing a variable magnetic field in the region of said sample cell.

17. The apparatus of claim 16, wherein said sample cell has two closely spaced parallel sides of rectangular shape which provide an enlarged surface area to said cold and warm fluid sources.

18. The apparatus of claim 17, wherein said sample cell comprises a cap, which seals the sample therein.

* * * * *